United States Patent
Teranishi et al.

(10) Patent No.: US 10,534,016 B2
(45) Date of Patent: Jan. 14, 2020

(54) PROBE PIN

(71) Applicant: OMRON Corporation, Kyoto-shi, Kyoto (JP)

(72) Inventors: Hirotada Teranishi, Osaka (JP); Takahiro Sakai, Moriyama (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/751,489

(22) PCT Filed: Mar. 14, 2017

(86) PCT No.: PCT/JP2017/010191
§ 371 (c)(1),
(2) Date: Feb. 9, 2018

(87) PCT Pub. No.: WO2017/217041
PCT Pub. Date: Dec. 21, 2017

(65) Prior Publication Data
US 2019/0094269 A1  Mar. 28, 2019

(30) Foreign Application Priority Data

Jun. 17, 2016 (JP) .................................. 2016-121150

(51) Int. Cl.
*G01R 31/20* (2006.01)
*G01R 1/067* (2006.01)
(Continued)

(52) U.S. Cl.
CPC ......... *G01R 1/06738* (2013.01); *G01R 1/067* (2013.01); *G01R 1/06722* (2013.01); *G01R 1/073* (2013.01); *H01R 13/24* (2013.01)

(58) Field of Classification Search
CPC  G01R 1/067; G01R 1/06738; G01R 1/06722; G01R 1/0735; G01R 1/07378;
(Continued)

(56) References Cited

U.S. PATENT DOCUMENTS 5,106,328 A * 4/1992 Prochaska ............ H01R 13/187
439/751
6,471,524 B1 * 10/2002 Nakano ................ G01R 1/0483
439/66

(Continued)

FOREIGN PATENT DOCUMENTS

JP   H08-017500 A   1/1996
JP   2000-338175 A  12/2000
(Continued)

OTHER PUBLICATIONS

English translation of the International Search Report of PCT/JP2017/010191 dated Jun. 6, 2017.
(Continued)

*Primary Examiner* — Thang X Le
(74) *Attorney, Agent, or Firm* — Metrolex IP Law Group, PLLC (57) ABSTRACT

A probe pin includes an elastic portion, a first contact portion having a pair of leg portions that extends from a first end of the elastic portion along a longitudinal direction and is bendable in a direction away from each other, and that has a pair of contact portions each of which is disposed at each tip of the pair of leg portion and is urged by the elastic portion in a direction along the longitudinal direction through the pair of leg portions to be able to be brought into contact with a projecting contact of an inspection object, and a second contact portion that is disposed at a second end of the elastic portion and is electrically connected to the first contact portion. Between the pair of leg portions, a gap into which the projecting contact of the inspection object can be inserted is provided, and in a state where the projecting contact is inserted into the gap, the pair of contact portions and the projecting contact can be brought into contact with each other.

5 Claims, 9 Drawing Sheets

(51) Int. Cl.
*G01R 1/073* (2006.01)
*H01R 13/24* (2006.01)
(58) Field of Classification Search
CPC ............ G01R 1/06755; G01R 1/06788; G01R 1/07314; G01R 1/06711; G01R 1/07342; G01R 1/07307; G01R 1/07357; G01R 1/06716; G01R 31/2889; G01R 31/3627; G01R 31/3682; G01R 31/3696; G01R 31/2831
See application file for complete search history.

(56) References Cited

U.S. PATENT DOCUMENTS

| | | | | |
|---|---|---|---|---|
| 8,926,379 B2* | 1/2015 | Vinther | ................... | H01R 4/48 439/817 |
| 9,726,692 B2* | 8/2017 | Sakai | ..................... | G01R 1/067 |
| 2001/0039128 A1* | 11/2001 | Tateishi | ............... | G01R 1/0466 439/71 |
| 2004/0104737 A1* | 6/2004 | Haga | .................. | G01R 1/06738 324/755.05 |
| 2010/0285698 A1* | 11/2010 | Lee | .................... | G01R 1/06722 439/786 |
| 2012/0129408 A1* | 5/2012 | Kimura | ............. | G01R 1/06722 439/817 |
| 2016/0018440 A1* | 1/2016 | Chung | ............... | G01R 1/06722 324/755.05 |
| 2016/0072202 A1* | 3/2016 | Hemmi | ............. | H01R 13/2421 439/786 |
| 2017/0115324 A1* | 4/2017 | Teranishi | ............... | G01R 1/067 |

FOREIGN PATENT DOCUMENTS

| | | |
|---|---|---|
| JP | 2001043920 A | 2/2001 |
| JP | 2001-318119 A | 11/2001 |
| JP | 2004-138405 A | 5/2004 |
| JP | 2008-516398 A | 5/2008 |
| JP | 2009031087 A | 2/2009 |
| JP | 2010532908 A | 10/2010 |
| JP | 2014-71091 A | 4/2014 |
| KR | 10-2015-0020500 A | 2/2015 |

OTHER PUBLICATIONS

English translation of the Written Opinion of PCT/JP2017/010191 dated Jun. 6, 2017.
Office Action dated Feb. 20, 2018 in a counterpart Korean patent application.
Office Action dated Aug. 19, 2019 in a counterpart Korean patent application.

* cited by examiner

PROBE PIN

TECHNICAL FIELD

The present invention relates to a probe pin.

BACKGROUND ART

In an electronic component module such as a camera and a liquid crystal panel, a continuity inspection, an operating characteristic inspection, and the like are typically performed in its manufacturing process. These inspections each are performed by connecting an FPC contact electrode installed in the electronic component module to be connected to a main body substrate, or an electrode portion of a mounted board-to-board connector or the like, to an inspection device by using a probe pin.

This kind of probe pin is described in PTL 1, for example. The probe pin is composed of an elastic portion that expands and contracts in its longitudinal direction and a contact portion that is provided at both ends in the longitudinal direction of the elastic portion.

CITATION LIST

Patent Literature

PTL 1: Japanese Unexamined Patent Publication No. 2008-516398

SUMMARY OF INVENTION

Technical Problem

Unfortunately, the probe pin is brought into contact with each of an inspection object and an inspection device at one contact portion, so that when a terminal of the inspection object is a projecting contact of a male connector of a board-to-board connector, or the like, for example, it is impossible to stably connect the contact portion of the probe pin to the projecting contact of the inspection object, and whereby contact reliability cannot be secured in some cases.

Thus, it is an object of the present invention to provide a probe pin capable of being stably connected to a projecting contact.

Solution to Problem

A probe pin of an aspect of the present invention includes: an elastic portion that expands and contracts along its longitudinal direction; a first contact portion that has a pair of leg portions that extends from a first end of the elastic portion along the longitudinal direction and is bendable in a direction away from each other, and that has a pair of contact portions each of which is disposed at each tip of the pair of leg portions while being urged by the elastic portion in a direction along the longitudinal direction through the pair of leg portions to be able to be brought into contact with a projecting contact of an inspection object; and a second contact portion that is disposed at a second end of the elastic portion to be urged by the elastic portion in a direction opposite to an urging direction of the first contact portion, and that is electrically connected to the first contact portion, wherein a gap is provided between the pair of leg portions to allow the projecting contact of the inspection object into the gap, and when the projecting contact is inserted into the gap, the pair of contact portions of the pair of leg portions of the first contact portion and the projecting contact can be brought into contact with each other.

Advantageous Effects of Invention

According to the probe pin of the above aspect, it is possible to stably connect the pair of contact portions at the tips of the bendable leg portions to the projecting contact.

DESCRIPTION OF EMBODIMENTS

Hereinafter, an embodiment of the present invention will be described with reference to accompanying drawings. In the following description, terms (e.g., terms including "upper", "lower", "right", and "left") each indicating a specific direction or position are used as necessary, and these terms are used to facilitate understanding of the invention with reference to the drawings, and the technical scope of the present invention is not limited by the meaning of these terms. In addition, the following description is merely intrinsically exemplary, and is not intended to limit the invention, its application, or its use. Further, the drawings are schematic, and a ratio of each dimension and the like do not necessarily coincide with actual ones.

First Embodiment

Figure 1:
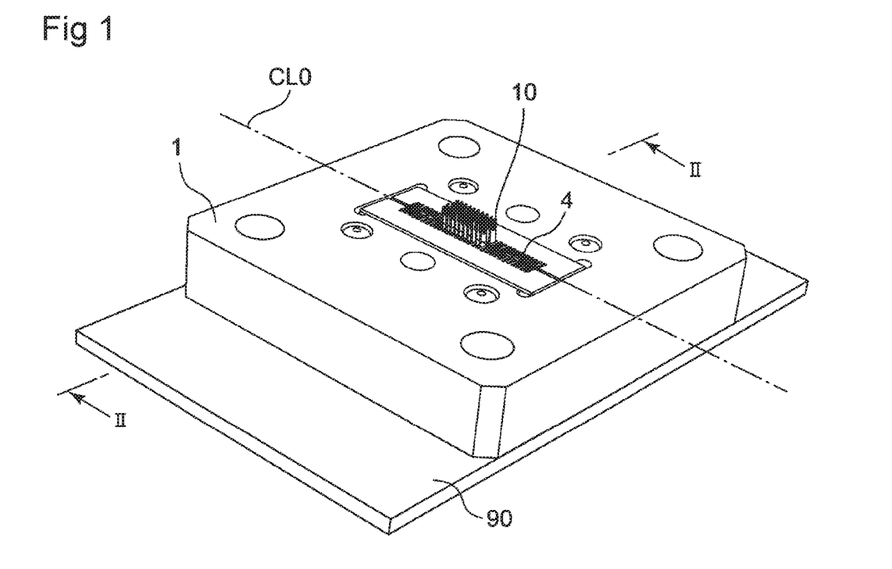
FIG. 1 is a perspective view for illustrating a use state of a probe pin according to a first embodiment of the present invention.
Figure 2:
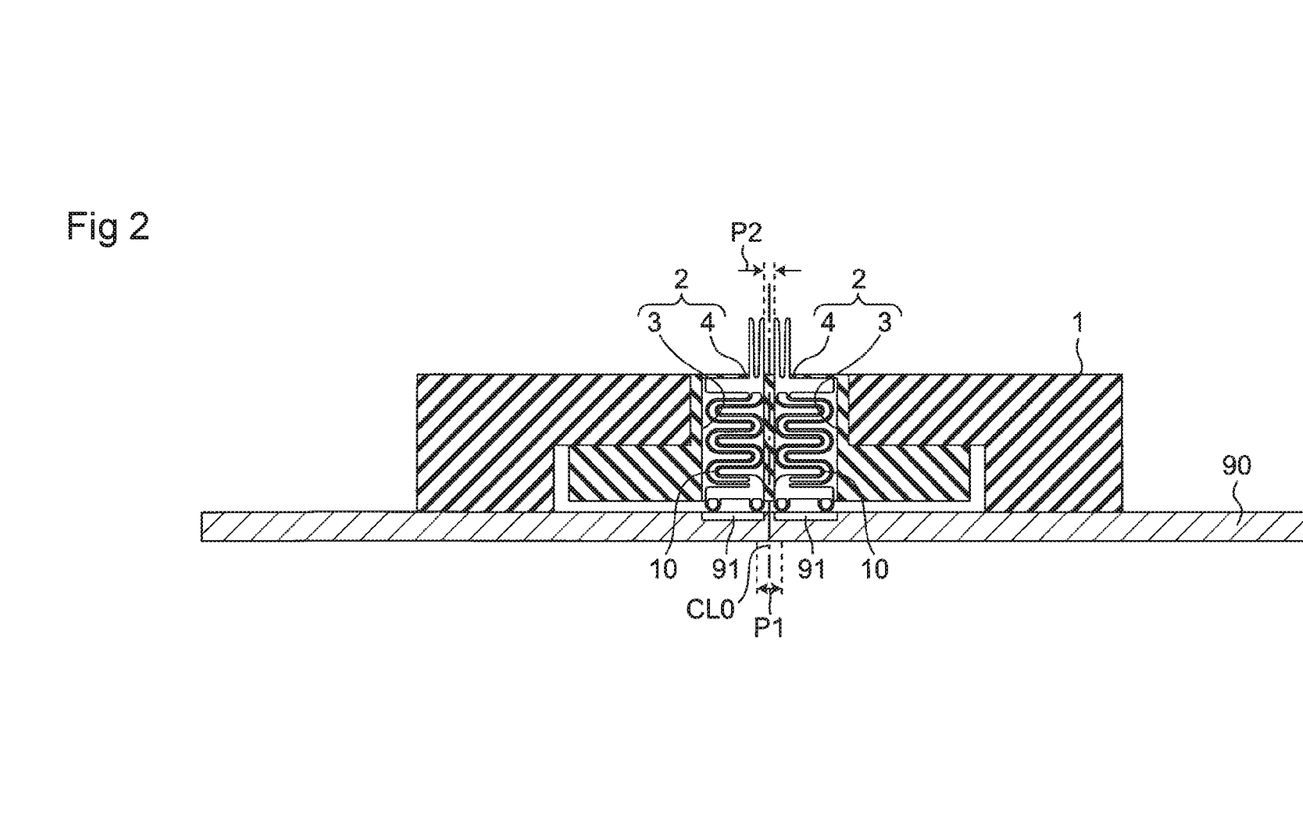
FIG. 2 is a sectional view taken along line II-II of FIG. 1.

As illustrated in FIG. 1, for example, a probe pin 10 according to a first embodiment of the present invention is used in a state of being housed in a socket 1 attached to a substrate 90 of an inspection apparatus, and constitutes an inspection unit together with the socket 1. As illustrated in FIG. 2, the socket 1 includes a plurality of pairs of housing portions 2 provided symmetrically with respect to a centerline CL0, and the probe pins 10 are housed in the respective housing portions 2.

Each of the housing portions 2 has a groove portion 3 capable of housing the probe pin 10, and a through hole 4 provided in a bottom surface of the groove portion 3, and the housing portions 2 are disposed at a regular interval along the centerline CL0 of the socket 1, as illustrated in FIG. 1.

Figure 3:
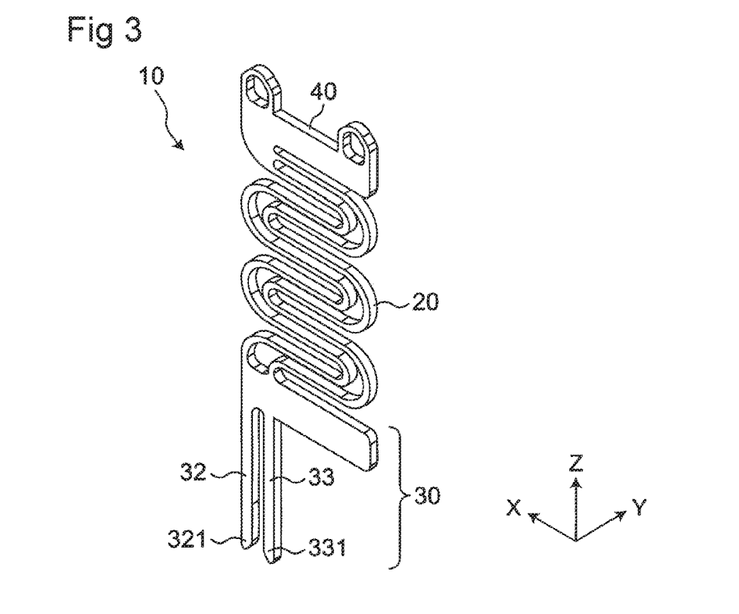
FIG. 3 is a perspective view of the probe pin according to the first embodiment of the present invention.

As illustrated in FIG. 3, the probe pin 10 includes an elastic portion 20, a first contact portion 30, and a second contact portion 40, the first and second contact portions 30 and 40 being provided at both respective ends in a longitudinal direction of the elastic portion 20. The probe pin 10 is a thin plate with conductivity, and is integrally formed by electroforming, for example.

In the following description, a width direction of a plate surface of the probe pin 10 is indicated as an X direction, a plate thickness direction of the probe pin 10, orthogonal to the X direction, is indicated as a Y direction, and a longitudinal direction of the elastic portion 20, orthogonal to the X and Y directions, is indicated as a Z direction.

Figure 4:
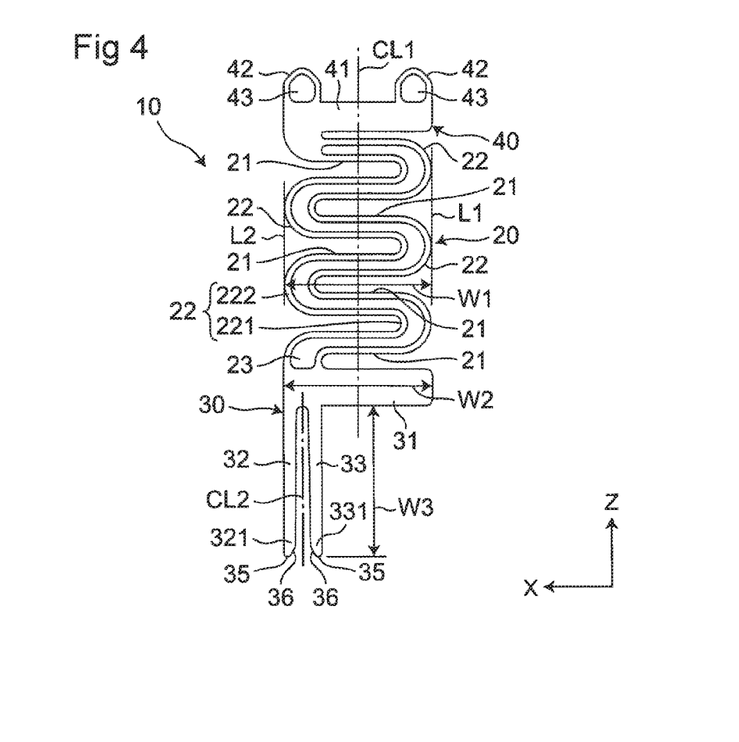
FIG. 4 is a plan view of the probe pin of FIG. 3.

As illustrated in FIG. 4, the elastic portion 20 has a serpentine shape in which straight portions 21 and curved portions 22 are alternately continuous along the Z direction, and is configured to expand and contract along the Z direction.

In a no-load state illustrated in FIG. 4, the straight portions 21 are parallel to each other in the X direction. The curved portions 22 each include a first curved portion 221 positioned on the right in the X direction, and a second curved portion 222 positioned on the left in the X direction. Then, a straight line L1 being a tangent line connecting vertexes of the first curved portions 221 adjacent to each other in the longitudinal direction of the elastic portion 20, and a straight line L2 being a tangent line connecting vertexes of the second curved portions 222 adjacent to each other in the longitudinal direction of the elastic portion 20, are parallel to each other in the X direction.

In addition, a through hole 23 passing through in the plate thickness direction (Y direction) and extending along the serpentine shape is provided in an intermediate portion in the width direction of each of the straight portions 21 of the elastic portion 20 and in an intermediate portion in the width direction of each of the curved portions 22. This enhances elasticity of the elastic portion 20.

As illustrated in FIG. 4, the first contact portion 30 includes a support portion 31 that is connected to a lower end of the elastic portion 20 in the Z direction, a pair of leg portions 32 and 33 that is bendable and extends downward in the Z direction from the support portion 31, and a pair of contact portions 321 and 331 each of which is disposed at each tip of the pair of leg portions 32 and 33 so as to be able to be brought into contact with a projecting contact of an inspection object. The pair of contact portions 321 and 331 can be urged downward in the Z direction by the elastic portion 20 via the pair of leg portions 32 and 33.

The support portion 31 has a substantially rectangular shape in plan view along the Y direction, and supports the probe pin 10 by being brought into contact with the groove portion 3 of the housing portion 2 when the probe pin 10 is housed in the housing portion 2 of the socket 1. The support portion 31 has a width W2 that is approximately the same as a width W1 that is the shortest distance between a straight line L1 being a tangent line connecting the second curved portions 222 adjacent to each other in the longitudinal direction of the elastic portion 20, and a straight line L2 being a tangent line connecting the first curved portions 221 adjacent to each other in the longitudinal direction of the elastic portion 20.

The support portion 31 is connected on its left side in the X direction and on its upper side in the Z direction to a lower end of the elastic portion 20 in the Z direction. In addition, the support portion 31 is connected on its left side in the X direction and on its lower side in the Z direction to the pair of leg portions 32 and 33. That is, a centerline CL1 of the X direction extending in the Z direction of the elastic portion 20 and a centerline CL2 of the X direction extending in the Z direction of the pair of leg portions 32 and 33 do not coincide with each other, and are displaced from each other. In other words, the elastic portion 20 and the pair of leg portions 32 and 33 are connected to each other via one end of the support portion 31 in the X direction away from the centerline CL1 extending in the Z direction of the elastic portion 20.

Each of the pair of leg portions 32 and 33 extends in the Z direction and is provided symmetrically with respect to the centerline CL2 of the X direction. The pair of leg portions 32 and 33 is provided with a gap 34 therebetween, the gap 34 being deformable in a direction in which the leg portions 32 and 33 approach each other. A projecting contact of an inspection object can be inserted into the gap 34.

In addition, each of the pair of leg portions 32 and 33 is bendable in a direction away from the centerline CL2 of the leg portions 32 and 33 in the X direction (or in a direction away from each other). That is, the leg portion 32 on the left side in the X direction is bendable toward the left side in the X direction, and the leg portion 33 on the right side in the X direction is bendable toward the right side in the X direction. In other words, when a projecting contact of an inspection object is inserted into the gap 34 between the leg portions 32 and 33, each of the contact portions 321 and 331 provided at the tips of the leg portions 32 and 33 can slide on the projecting contact in a direction away from each other while being in contact with the projecting contact.

Each of the pair of contact portions 321 and 331 at the tips (the lower end in the Z direction) of the leg portions 32 and 33 is provided with curved surfaces 35 that can be brought into contact with a projecting contact. In addition, each one of mutually facing surfaces of the pair of contact portions 321 and 331 of the leg portions 32 and 33 is provided with an inclined surface 36 with a flat surface or a curved recessed surface, the inclined surfaces 36 continuous with the each curved surface 35 to be away from an another one of the mutually facing surfaces toward an urging direction of the elastic portion 20 or downward in the Z direction.

The second contact portion 40 includes a base portion 41 connected to an upper end of the elastic portion 20 in the Z direction, and a pair of projecting portions 42 protruding upward in the Z direction from the base portion 41. The second contact portion 40 is electrically connected to the first contact portion 30. The second contact portion 40 is urged upward in the Z direction by the elastic portion 20, or in a direction opposite to an urging direction of the first contact portion 30.

The base portion 41 has a substantially rectangular shape in plan view along the Y direction. The base portion 41 is connected on its left side in the X direction and on its lower side in the Z direction to an upper end of the elastic portion 20 in the Z direction.

The pair of projecting portions 42 are provided symmetrically with respect to the centerline CL1 of the elastic portion 20 in the X direction. Each of the projecting portions 42 is curved such that its tip (upper end in the Z direction)

protrudes upward in the Z direction to be brought into contact with a terminal 91 (illustrated in FIG. 2) provided on the substrate 90 of the inspection device while being housed in the socket 1.

In addition, each of the projecting portions 42 is provided with a through hole 43 passing through in the plate thickness direction (Y direction). As a result, each of the projecting portions 42 elastically deforms when being brought into contact with the terminal 91 of the substrate 90 to press the terminal 91 by its elastic force, so that contact reliability between the probe pin 10 and the inspection device can be enhanced.

When each of the projecting portions 42 is provided at both respective ends of the base portion 41, it is possible to reduce a pitch P1 between the projecting portions 42 of the probe pins 10 adjacent to each other in the Y direction when the probe pins 10 are housed in the socket 1, as illustrated in FIG. 2. In addition, forming of the projecting portions 42 enables stable contact with the substrate 90 of the inspection device.

Figure 5:
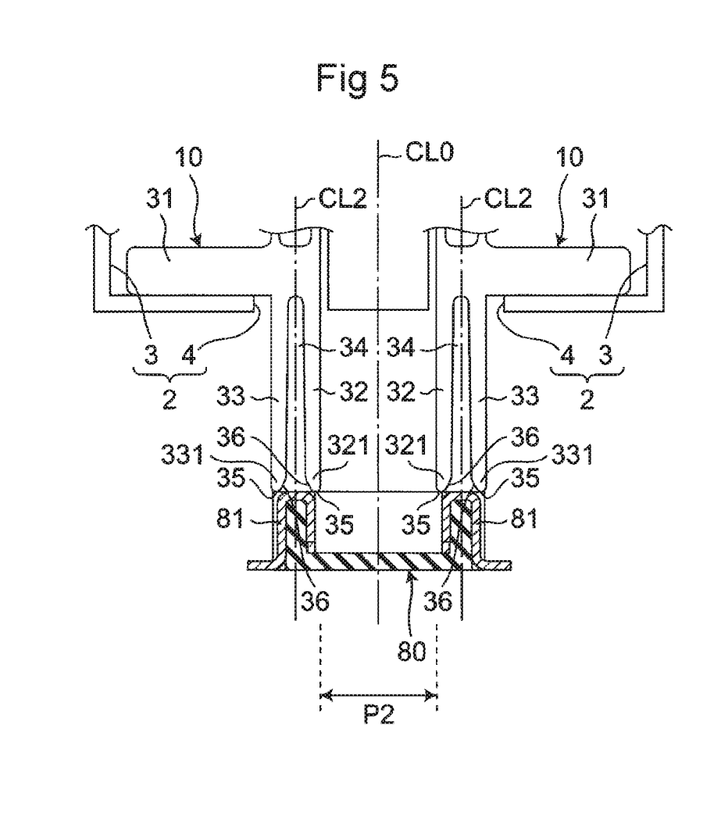
FIG. 5 is a sectional view illustrating a state before being brought into contact with a projecting contact of a male connector of the probe pin of FIG. 3.
Figure 6:
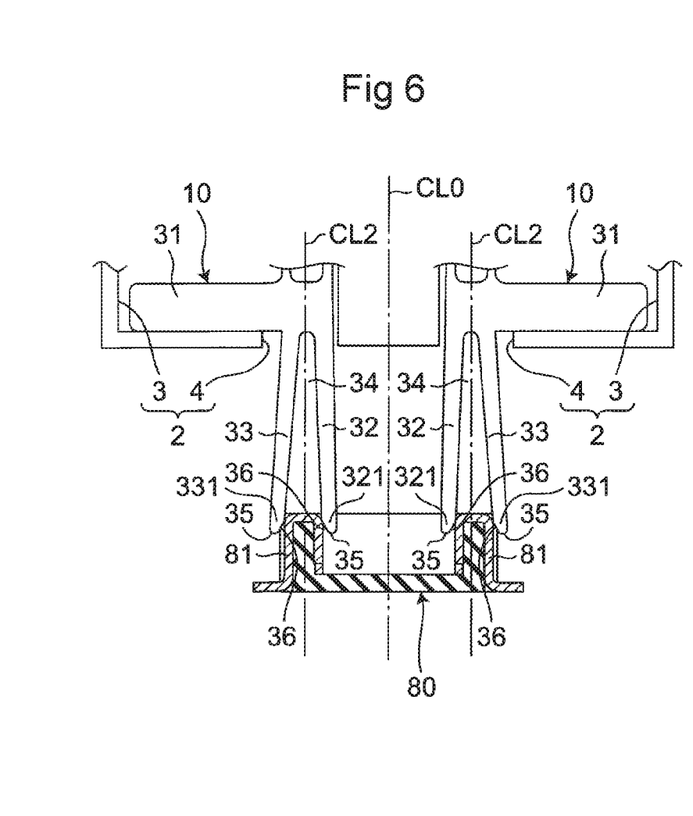
FIG. 6 is a sectional view illustrating a state in contact with the projecting contact of the male connector of the probe pin of FIG. 3.

Next, with reference to FIGS. 5 and 6, there is described operation in the case where two probe pins 10 are brought into contact with two respective adjacent projecting contacts 81 of an inspection object 80 while being housed in the housing portions 2 of the socket 1.

As illustrated in FIG. 5, when each of the probe pins 10 are brought close to the inspection object 80 while the projecting contact 81 is positioned between the pair of leg portions 32 and 33 of each of the probe pins 10, each of portions close to the centerline CL2 of the curved surfaces 35 is brought into contact with the projecting contact 81.

As each of the probe pins 10 is brought closer to the inspection object 80 and each of the projecting contacts of the inspection object 80 is inserted into the corresponding one of the gaps 34, as illustrated in FIG. 6, the leg portions 32 and 33 and the contact portions 321 and 331 are bent in a direction away from the centerline CL2 by the inserted inspection object 80, or in a direction away from each other. At this time, the projecting contact 81 moves from the curved surfaces 35 of the contact portions 321 and 331 while sliding toward the inclined surfaces 36 in a state in contact with the facing surfaces (hereinafter referred to as contact surfaces) of the contact portions 321 and 331.

Meanwhile, as each of the probe pins 10 is separated from the inspection object 80 and the projecting contacts 81 of the inspection object 80 are removed from the respective gaps 34, the contact portions 321 and 331 return in a direction approaching the centerline CL2, or in a direction approaching each other. At this time, each of the projecting contacts 81 moves from the inclined surface 36 while sliding toward the curved surface 35 in a state in contact with the contact surfaces of the contact portions 321 and 331.

As described above, in the probe pin 10 of the first embodiment, when the inspection object 80 is inserted into and removed from the probe pin 10, the projecting contact 81 moves while sliding or wiping in a state in contact with the contact surfaces of the contact portions 321 and 331. Thus, even when foreign matter adheres to the contact surfaces of the contact portions 321 and 331 or a surface of the projecting contact 81, the foreign matter is scraped by wiping between the contact portions 321 and 331 and the projecting contact 81. As a result, poor conduction due to foreign matter can be avoided to enable contact reliability to be secured.

The leg portions 32 and 33 is provided with the gap 84 therebetween, the gap 84 being deformable in a direction away from each other and allowing the projecting contact 81 of the inspection object 80 to be inserted thereinto, so that the contact portions 321 and 331 at tips of the leg portions 32 and 33 can be stably connected to the projecting contact 81 to enable contact reliability between the probe pin 10 and the inspection object 80 to be secured.

In addition, the leg portions 32 and 33 is bendable in a direction intersecting with each other in the Z direction (longitudinal direction) and away from the centerline CL2 extending in the Z direction of the leg portions 32 and 33, or in a direction approaching each other. This enables the projecting contact 81 to move more distance while being in contact with the leg portions 32 and 33, so that wiping effect can be enhanced.

Further, the centerline CL1 extending in the Z direction (longitudinal direction) of the elastic portion 20 and the centerline CL2 extending in the Z direction of the pair of leg portions 32 and 33 do not coincide with each other, and are displaced from each other. Thus, because the leg portions 32 and 33 is disposed in an end portion of the support portion 31 of each of the two probe pins 10 on a side where the two probe pins 10 are close to each other, when the two probe pins 10 are housed in the housing portions 2 of the socket 1, it is possible to deal with a narrow pitch in which a pitch between the two adjacent projecting contacts 81 of the inspection object 80 is narrowed in comparison with a state where the leg portions 32 and 33 is disposed such that the centerline CL2 coincides with the centerline CL1 of the elastic portion 20.

Each one of the mutually opposing surfaces of the contact portions 321 and 331 has the inclined surface 36 that is away from the other of the mutually facing surfaces toward the urging direction of the elastic portion 20, and the curved surfaces 35 are provided in the contact portions 321 and 331. This enables the projecting contact 81 of the inspection object 80 to be smoothly guided to the gap 34 between the leg portions 32 and 33.

In addition, when a distance W3 from the support portion 31 to the vertex of the curved surface 35 is adjusted, the amount of bend of the leg portions 32 and 33 can be adjusted when the projecting contact 81 of the inspection object 80 is inserted into the gap 34. For example, when a ratio of the distance W3 to the width W2 of the support portion 31 is set to 1 or more to lengthen the leg portions 32 and 33, a bend dimension can be increased. This enables a sufficient wiping distance to be secured so that foreign matter on the contact surfaces of the leg portions 32 and 33 can be scraped by the projecting contact 81 of the inspection object 80.

The probe pin 10 has the gap 34 into which the projecting contact 81 of the inspection object 80 can be inserted, the gap 34 being provided between the contact portions 321 and 331 of the leg portions 32 and 33 that can be bent in a direction away from each other. When the contact portions 321 and 331 and the projecting contact 81 can be brought into contact with each other when the projecting contact 81 is inserted into the gap 34, stable contact can be maintained.

For example, the leg portions 32 and 33 is not limited to structure in which both of them are bendable, and at least one of them may be bendable.

The curved surface 35 and the inclined surface 36 of each of the leg portions 32 and 33 may be eliminated, or may be provided in any one of the leg portions 32 and 33. Only the curved surface 35 may be provided, or only the inclined surface 36 may be provided. However, it is preferable to dispose the curved surface 35 or the inclined surface 36 to secure more stable contact with the projecting contact 81.

When there is no need to deal with a narrow pitch, the probe pin 10 may be formed such that the centerline CL1 extending in the Z direction of the elastic portion 20 coincides with the centerline CL2 extending in the Z direction of the leg portions 32 and 33.

Figure 7:
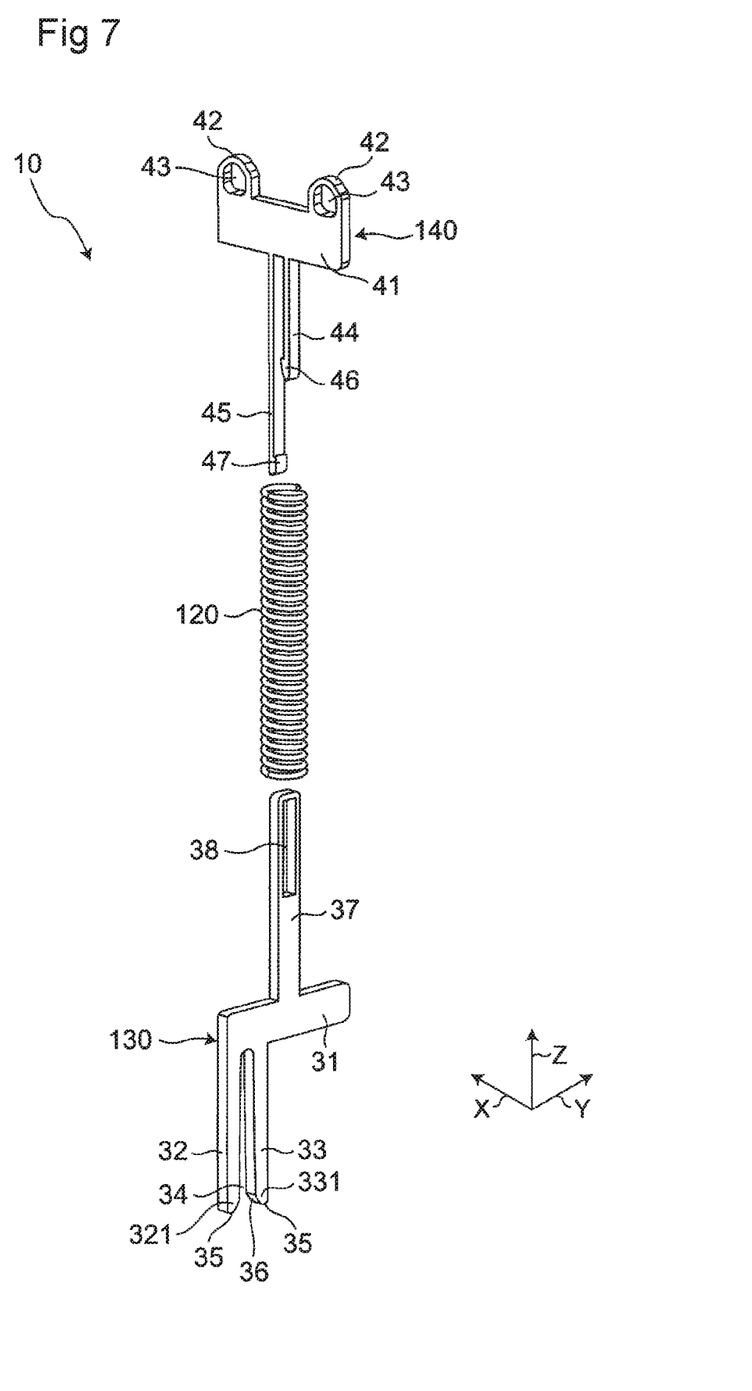
FIG. 7 is a perspective view illustrating another example of the probe pin of FIG. 3.

The probe pin 10 is not limited to the structure in which the elastic portion 20, the first contact portion 30 and the second contact portion 40 are integrally formed. For example, as illustrated in FIG. 7, a first contact portion 130 and a second contact portion 140 may be formed separately.

In this case, the first contact portion 130 and the second contact portion 140 are partially positioned inside a coil spring 120 as an elastic body, and are connected to each other such that their plate surfaces are orthogonal to each other. In FIG. 7, a direction along the plate surface of the first contact portion 130 is indicated as a Y direction, a direction along the plate surface of the second contact portion 140 is indicated as an X direction, and a direction orthogonal to the X direction and the Y direction is indicated as a Z direction.

The first contact portion 130 extends upward in the Z direction from the support portion 31, and has an insertion portion 37 disposed inside the coil spring 120. The insertion portion 37 is provided with a through hole 38 passing through in the plate thickness direction (X direction) and extending along the Z direction.

The second contact portion 140 extends downward in the Z direction from the base portion 41, and has a pair of elastic pieces 44 and 45 disposed inside the coil spring 120. The pair of elastic pieces 44 and 45 is provided with a gap therebetween, the gap being larger than a plate thickness of the first contact portion 130. The one elastic piece 44 is provided at its tip with a protrusion 46 that can be fitted into the through hole 38 of the first contact portion 130. When the protrusion 46 is fitted into the through hole 38, the first contact portion 130 and the second contact portion 140 are connected to each other. The other elastic piece 45 is provided at its tip with a protrusion 47 that is brought into contact with a surface between the through hole 38 of the insertion portion 37 of the first contact portion 130 and the support portion 31 when the first contact portion 130 and the second contact portion 140 are connected to each other.

The coil spring 120 is supported at its both ends with the support portion 31 of the first contact portion 130 and the base portion 41 of the second contact portion 140, respectively, in a state where the first contact portion 130 and the second contact portion 140 are connected to each other, and thus the coil spring 120 is always compressed.

Second Embodiment

Figure 8:
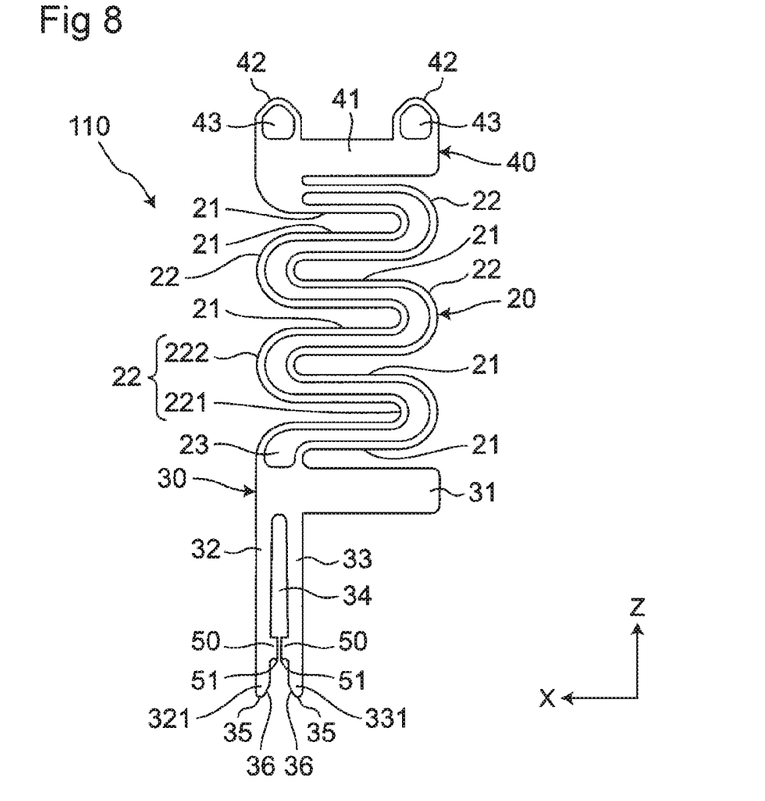
FIG. 8 is a plan view of a probe pin according to a second embodiment of the present invention.

As illustrated in FIG. 8, a probe pin 110 of a second embodiment is different from the probe pin 10 of the first embodiment in that a stopper 50 is provided on each of opposing surfaces (contact surfaces) of a pair of leg portions 32 and 33.

In the second embodiment, the same reference numerals are assigned to the same parts as those in the first embodiment to eliminate description thereof, and differences from the first embodiment will be described.

Figure 9:
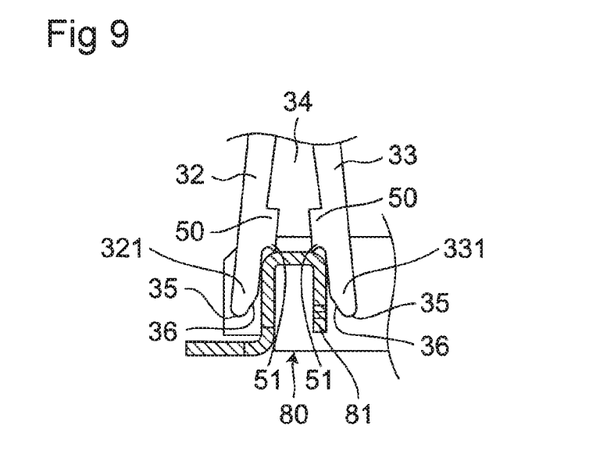
FIG. 9 is a sectional view illustrating a state in contact with a projecting contact of a male connector of the probe pin of FIG. 8.

The respective stoppers 50 protrude in a direction (X direction) in which they approach each other so as to close the gap 34 from the contact surfaces of the respective leg portions 32 and 33. When each of the stoppers 50 is provided as described above, the amount of insertion of a projecting contact 81 can be regulated, as illustrated in FIG. 9. This prevents excessive insertion of the projecting contact 81, so that trouble caused by excessive insertion of the projecting contact 81 such as breakage of the probe pin 110 can be avoided.

The stopper 50 is provided at its lower end in the Z direction with a protruding portion 51. As illustrated in FIG. 9, the protruding portion 51 is configured to be brought into contact with the projecting contact 81 when the projecting contact 81 is inserted into the gap 34. This causes not only the contact portions 321 and 331, but also the protruding portion 51 of each of the stoppers 50 to be brought into contact with the projecting contact 81, so that high contact reliability between the probe pin 10 and the inspection object 80 can be achieved.

Figure 10:
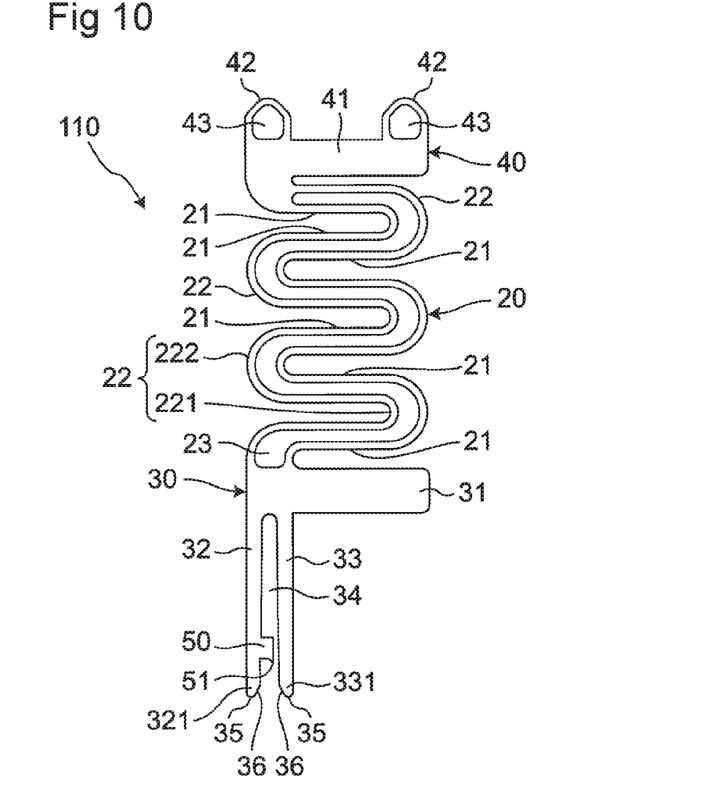
FIG. 10 is a plan view illustrating another example of the probe pin of FIG. 8.

As illustrated in FIG. 10, the stopper 50 may be provided on only one of the pair of leg portions 32 and 33. In this case, when size of the stopper 50 is adjusted, it is possible to adjust a position where the protruding portion 51 and the projecting contact 81 are brought into contact with each other. As a result, the amount of insertion of the projecting contact 81 can be regulated.

Third Embodiment

Figure 11:
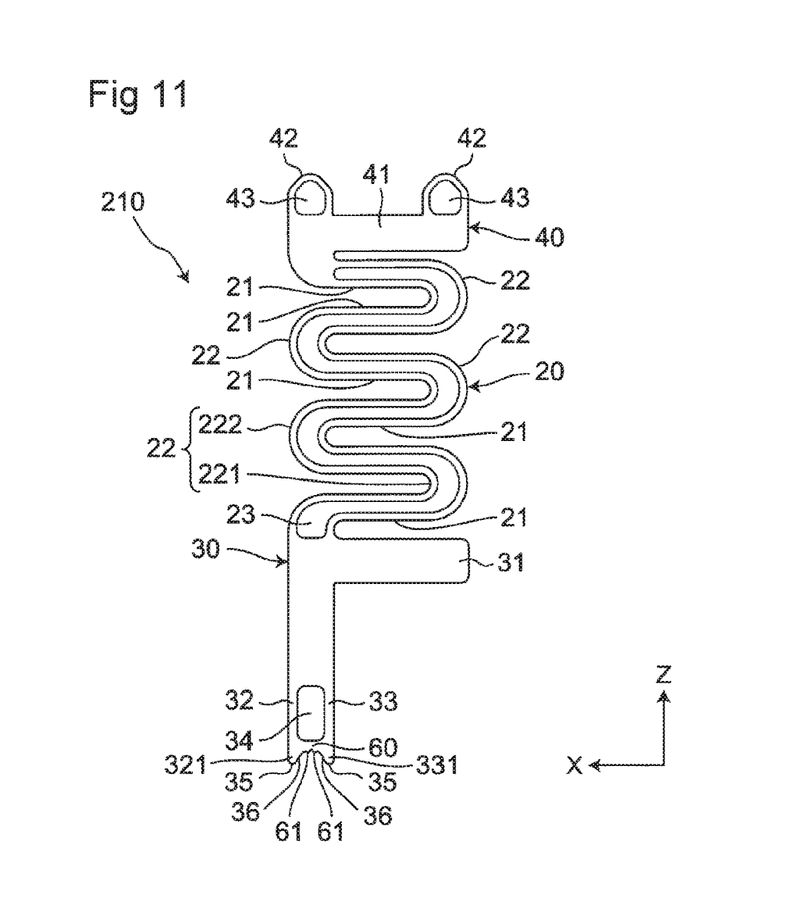
FIG. 11 is a front view of a probe pin according to a third embodiment of the present invention.

As illustrated in FIG. 11, a probe pin 210 of a third embodiment is different from the probe pin 10 of the first embodiment in that a stopper 60 connecting a pair of leg portions 32 and 33 is provided.

In the third embodiment, as in the second embodiment, the same reference numerals are assigned to the same parts as those in the first embodiment to eliminate description thereof, and differences from the first embodiment will be described.

The stopper 60 is provided on an upper side in the Z direction of inclined surfaces 36 of a pair of contact portions 321 and 331 of a pair of leg portions 32 and 33, and the stopper 60 has a lower surface in the Z direction that is continuous with the inclined surfaces 36. When the stopper 60 is provided as described above, the amount of insertion of a projecting contact 81 can be regulated, as illustrated in FIG. 11.

Figure 12:
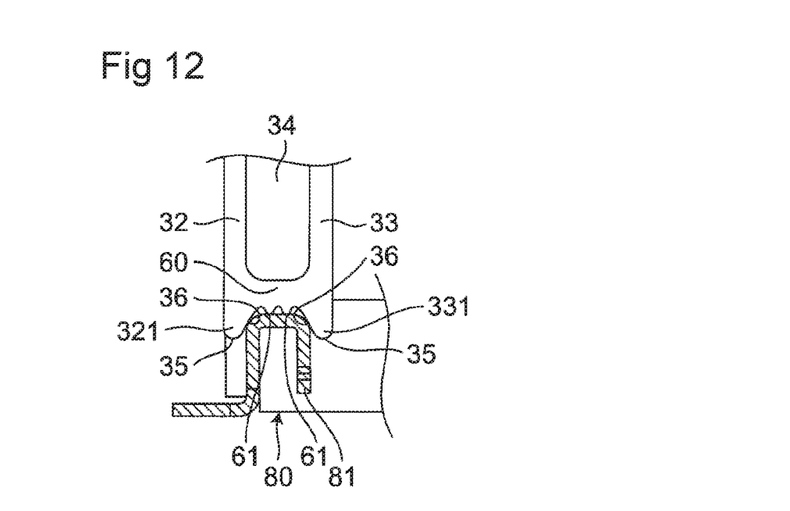
FIG. 12 is a sectional view illustrating a state in contact with a projecting contact of a male connector of the probe pin of FIG. 11.

The lower surface in the Z direction of the stopper 60 is provided with a pair of protruding portions 61. As illustrated in FIG. 12, the protruding portions 61 are configured to be brought into contact with a projecting contact 81 together with a pair of contact portions 321 and 331 when the projecting contact 81 is inserted into a gap 34. This enables higher contact reliability between the probe pin 210 and the inspection object 80 to be achieved.

The probe pin 210 of the third embodiment includes the stopper 60 provided near tips of the leg portions 32 and 33, so that the amount of bend of the leg portions 32 and 33 necessary for securing a sufficient wiping distance is smaller than that of the probe pin 10 of the first embodiment. Thus, size of the gap 34 is adjusted so that length of the leg portions 32 and 33 is made shorter than that of the probe pin 10 of the first embodiment. This increases strength of a first contact portion 30.

Fourth Embodiment

Figure 13:
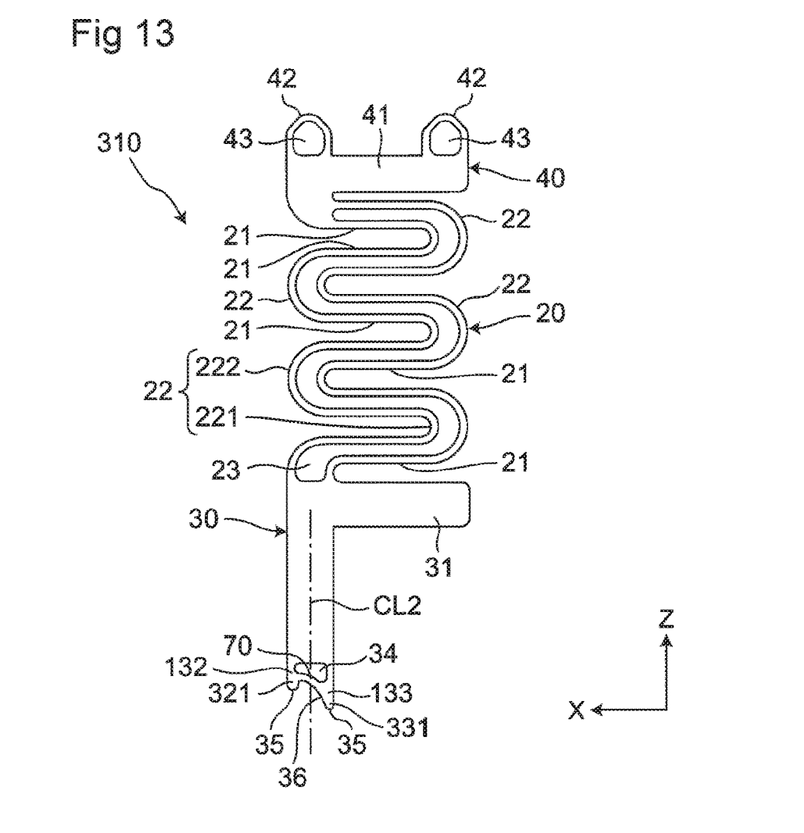
FIG. 13 is a front view of a probe pin according to a fourth embodiment of the present invention.

As illustrated in FIG. 13, a probe pin 310 of the fourth embodiment is different from the probe pin 10 of the first embodiment in that a first contact portion 30 includes a pair of leg portions 132 and 133 each with a different length, a connecting portion 70 connecting the leg portions 132 and 133, and a pair of contact portions that are asymmetrically disposed with respect to a centerline of the leg portions 132 and 133.

In the fourth embodiment, as in the second and third embodiments, the same reference numerals are assigned to the same parts as those in the first embodiment to eliminate description thereof, and differences from the first embodiment will be described.

The leg portions 132 and 133 is configured such that a first leg portion 132 on the left in an X direction has a shorter distance from the support portion 31 to the vertex of a curved surface 35 than a second leg portion 133 on the right in the X direction. The first leg portion 132 includes a contact portion 321 that is not provided with an inclined surface 36.

The connecting portion 70 is provided such that its lower surface in a Z direction is continuous with not only an inclined surface 36 of a contact portion 331 of the second leg portion 133, but also with a surface facing the second leg portion 133 upward in the Z direction from the curved surface 35 of the contact portion 331 of the first leg portion 132.

Figure 14:
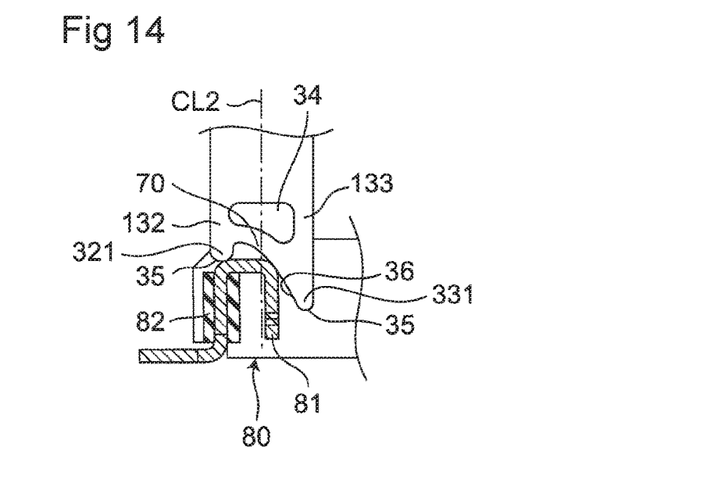
FIG. 14 is a sectional view illustrating a state in contact with a projecting contact of a male connector of the probe pin of FIG. 13.

In the probe pin 310 of the fourth embodiment, as the projecting contact 81 is inserted into the gap 34, a portion of the curved surface 35 of the contact portion 331 of the second leg portion 133, close to a centerline CL2, and the projecting contact 81, are brought into contact with each other. As the projecting contact 81 is further inserted into the gap 34, the projecting contact 81 slides from the curved surface 35 toward the inclined surface 36 while being in contact with the contact portion 331 of the second leg portion 133. Then, the projecting contact 81 moves until being brought into contact with a portion of the curved surface 35 of the contact portion 321 of the first leg portion 132, close to the centerline CL2, as illustrated in FIG. 14.

Thus, the probe pin 310 of the fourth embodiment allows only the second leg portion 133 to bend, and allows the curved surface 35 of the first leg portion 132 to also serve as a stopper which regulates the amount of insertion of the projecting contact 81.

As described above, when the leg portions 132 and 133 is provided asymmetrically with respect to the centerline CL2 extending in the Z direction, both of the leg portions 132 and 133 can be brought into contact with the projecting contact 81 even when one of the side portions of the projecting contact 81 of the inspection object 80 is covered with resin 82 or the like, for example. This enables high contact reliability between the probe pin 210 and the inspection object 80 to be achieved.

While various embodiments of the present invention have been described in detail with reference to the drawings, finally, various aspects of the present invention will be described.

A probe pin according to a first aspect of the present invention includes: an elastic portion that expands and contracts along its longitudinal direction; a first contact portion that has a pair of leg portions that extends from one end of the elastic portion along the longitudinal direction and is bendable in a direction away from each other, and that has a pair of contact portions each of which is disposed at each tip of the pair of leg portions while being urged by the elastic portion in a direction along the longitudinal direction through the pair of leg portions to be able to be brought into contact with a projecting contact of an inspection object; and a second contact portion that is disposed at the other end of the elastic portion to be urged by the elastic portion in a direction opposite to an urging direction of the first contact portion, and that is electrically connected to the first contact portion, wherein a gap is provided between the pair of leg portions to allow the projecting contact of the inspection object to be inspected to be inserted into the gap, and when the projecting contact is inserted into the gap (i.e., in a state where the projecting contact is inserted into the gap), the pair of contact portions of the pair of leg portions of the first contact portion and the projecting contact can be brought into contact with each other.

According to the probe pin of the first aspect, the contact portions is brought into contact with the projecting contact while the leg portions bends freely in a direction away from each other with respect to the projecting contact, so that the probe pin can be stably connected to the projecting contact. In addition, the projecting contact moves while sliding in a state in contact with the contact portions when the projecting contact is inserted, so that wiping effect enables conduction failure due to foreign matter attached to surfaces of the leg portions, the surfaces being in contact with the projecting contact, to be avoided.

In a probe pin according to a second aspect of the present invention, the probe pin includes a stopper which regulates insertion of the projecting contact in at least one of mutually facing surfaces of the pair of leg portions.

According to the probe pin of the second aspect, the stopper can prevent excessive insertion of the projecting contact.

In a probe pin according to a third aspect of the present invention, at least one of the leg portions is bendable in a direction away from the other of the pair of leg portions.

According to the probe pin of the third aspect, it is possible to increase a distance by which the projecting contact moves while being in contact with the leg portions, so that wiping effect can be enhanced.

In a probe pin according to a fourth aspect of the present invention, a centerline along the longitudinal direction of the pair of leg portions and a centerline along a longitudinal direction of the elastic portion are displaced from each other.

According to the probe pin of the fourth aspect, the leg portions is disposed such that its centerline along its longitudinal direction and a centerline of the elastic portion along its longitudinal direction do not coincide with each other to be displaced from each other. Thus, it is possible to deal with a narrow pitch in which a pitch between two adjacent projecting contacts of the inspection object is narrowed, in comparison with a state where the leg portions is disposed such that its centerline along its longitudinal direction coincides with the centerline of the elastic portion along its longitudinal direction.

In a probe pin according to a fifth aspect of the present invention, each one of mutually facing surfaces of the pair of contact portions of the pair of leg portions of the first contact includes an inclined surface away from the other of the mutually facing surfaces toward an urging direction of the elastic portion.

According to the probe pin of the fifth aspect, it is possible to smoothly guide the projecting contact to the gap between the leg portions.

In a probe pin according to a sixth aspect of the present invention, each of the pair of contact portions of the pair of leg portions of the first contact portion has a curved surface.

According to the probe pin of the sixth aspect, it is possible to smoothly guide the projecting contact to the gap between the leg portions.

When any embodiments or modifications of the various embodiments or modifications are suitably combined with each other, it is possible to achieve respective effects possessed by them. In addition, combinations of embodiments themselves or examples themselves, or combinations of embodiments and examples, are possible, and combinations of features in different embodiments or examples are also possible.

While the present invention is fully described in association with the preferred embodiments with reference to the accompanying drawings, various variations and modifications are obvious to those skilled in the art. Such variations and modifications should be understood to be included in the scope of the present invention according to the appended claims unless without departing from the scope thereof.

INDUSTRIAL APPLICABILITY

The probe pin of the present invention can be applied to an inspection unit used for inspecting a liquid crystal panel having a male connector as a terminal, for example.

REFERENCE SIGNS LIST 1. socket
2. housing portion
3. groove portion
4. through hole
10, 110, 210, 310. probe pin
20. elastic portion
120. coil spring
21. straight portion
22. curved portion
23. through hole
221. first curved portion
222. second curved portion
30, 130. first contact portion
31. support portion
32, 33, 132, 133. leg portion
321, 331. contact portion
34. gap
35. curved surface
36. inclined surface
37. insertion portion
38. through hole
40, 140. second contact portion
41. base portion
42. projecting portion
43. through hole
44, 45. elastic piece
46, 47. protrusion
50, 60. stopper
51, 61. protruding portion
70. connecting portion
80. inspection object
81. projecting contact
90. substrate
91. Terminal
CL0. centerline (of socket)
CL1. centerline (of elastic portion)
CL2. centerline (of pair of legs)
L1. straight line (connecting vertexes of first curved portion)
L2. straight line (connecting vertexes of second curved portion)
W1. width of elastic portion
W2. width of support portion
W3. distance from support portion to vertex of curved surface
P1. pitch (between projecting portion of adjacent probe pins)
P2. pitch (between leg portions of adjacent probe pins)

The invention claimed is:

1. A probe pin comprising:
an elastic portion that expands and contracts along its longitudinal direction;
a first contact portion that has a pair of leg portions that extends from a first end of the elastic portion along the longitudinal direction and is bendable in a direction away from each other, and that has a pair of contact portions each of which is disposed at each tip of the pair of leg portions while being urged by the elastic portion in a direction along the longitudinal direction through the pair of leg portions to be able to be brought into contact with a projecting contact of an inspection object; and
a second contact portion that is disposed at a second end of the elastic portion to be urged by the elastic portion in a direction opposite to an urging direction of the first contact portion, and that is electrically connected to the first contact portion,
wherein
a gap is provided between the pair of leg portions to allow the projecting contact of the inspection object to be inspected to be inserted into the gap,
in a state where the projecting contact is inserted into the gap, the pair of contact portions of the pair of leg portions of the first contact portion and the projecting contact can be brought into contact with each other, and
the probe pin further comprises a stopper, which regulates insertion of the projecting contact in at least one of mutually facing surfaces of the pair of leg portions.

2. The probe pin according to claim 1, wherein at least one of the pair of leg portions is bendable in a direction away from an another one of the pair of leg portions.

3. The probe pin according to claim 1, wherein a centerline along a longitudinal direction of the pair of leg portions and a centerline along the longitudinal direction of the elastic portion are displaced from each other.

4. The probe pin according to claim 1, wherein each one of mutually facing surfaces of the pair of contact portions of the pair of leg portions of the first contact portion includes an inclined surface away from an another one of the mutually facing surfaces toward an urging direction of the elastic portion.

5. The probe pin according to claim 1, wherein each of the pair of contact portions of the pair of leg portions of the first contact portion has a curved surface.

* * * * *